United States Patent
Rao et al.

(10) Patent No.: US 12,346,559 B2
(45) Date of Patent: Jul. 1, 2025

(54) DATA TRANSFERS IN NEURAL PROCESSING

(71) Applicant: Arm Limited, Cambridge (GB)

(72) Inventors: Jayavarapu Srinivasa Rao, Cambridgeshire (GB); Davide Marani, Cambridgeshire (GB); Abhiram Anantharamu, Cambridgeshire (GB)

(73) Assignee: Arm Limited, Cambridge (GB)

( * ) Notice: Subject to any disclaimer, the term of this patent is extended or adjusted under 35 U.S.C. 154(b) by 459 days.

(21) Appl. No.: 17/650,608

(22) Filed: Feb. 10, 2022

(65) Prior Publication Data

US 2022/0253220 A1 Aug. 11, 2022

(30) Foreign Application Priority Data

Feb. 11, 2021 (GB) ................................ 2101934

(51) Int. Cl.
*G06F 3/06* (2006.01)
*G06N 3/063* (2023.01)

(52) U.S. Cl.
CPC .......... *G06F 3/0608* (2013.01); *G06F 3/0644* (2013.01); *G06F 3/0683* (2013.01); *G06N 3/063* (2013.01)

(58) Field of Classification Search
CPC .... G06F 3/0608; G06F 3/0644; G06F 3/0683; G06N 3/063; G06N 3/045; H03M 7/30; H04L 67/5651
See application file for complete search history.

(56) References Cited

U.S. PATENT DOCUMENTS

| | | | |
|---|---|---|---|
| 2018/0247227 A1* | 8/2018 | Holtham | G06N 7/01 |
| 2019/0197420 A1 | 6/2019 | Singh et al. | |
| 2019/0340488 A1 | 11/2019 | Fishel et al. | |
| 2020/0105021 A1* | 4/2020 | Sohre | G06T 1/60 |
| 2020/0302658 A1* | 9/2020 | Simon | H04N 19/176 |

OTHER PUBLICATIONS

United Kingdom Combined Search and Examination report dated Aug. 5, 2021 for United Kingdom Application No. GB 101934.4.

* cited by examiner

*Primary Examiner* — Hosain T Alam
*Assistant Examiner* — Alan Otto
(74) *Attorney, Agent, or Firm* — EIP US LLP

(57) ABSTRACT

A method of compressing data for transfer between a local storage of a processor and an external storage. The data is formed in an array of three or more dimensions and the method comprises sequentially reading data stored in the local storage to a compressor in units of data. Each unit has a predetermined unit size corresponding to an integer number of a tile size. At an extremity of the array, a partial unit of data is read in a case that the array size is not an integer multiple of the unit size. The partial unit of data is filled at the compressor and the filled data is compressed on a tile-by-tile basis to form compressed data. The compressed data associated with the unit of data is transferred to the external storage.

5 Claims, 12 Drawing Sheets

DATA TRANSFERS IN NEURAL PROCESSING

CROSS-REFERENCE TO RELATED APPLICATIONS

This application claims priority pursuant to 35 U.S.C. 119(a) to United Kingdom Patent Application No. 2101934.4, filed Feb. 11, 2021, which application is incorporated herein by reference in its entirety.

FIELD OF THE INVENTION

The present disclosure relates to methods, apparatus and computer software for transferring data in a data processing system. The disclosure has particular, but not exclusive, relevance for transferring data within a data processing system used to process a neural network.

DESCRIPTION OF THE RELATED TECHNOLOGY

Neural processing systems may contain a neural processing unit (NPU). NPUs, also known as neural processors, neural network accelerators and AI accelerators, are used to accelerate machine learning algorithms. Neural networks contain neural network layers with different types of feature map data. For example, a convolutional layer contains an input feature map (IFM) which is convolved with weight data to produce an output feature map (OFM). Neural networks also contain other layer types such as input, output, recurrent neural network, deconvolution, pooling, activation and fully connected. Processing these layers typically involves the transfer of large amounts of data between local storage circuitry and external storage circuitry using a great number of memory accesses including the reading and writing of data.

SUMMARY

According to a first aspect of the present disclosure there is provided a method of compressing data for transfer between a local storage of a processor and an external storage, wherein the data is part of an array of data of at least a portion of a layer of a neural network and has three or more dimensions, the method comprising: sequentially reading data stored in the local storage to a compressor in units of data along a first dimension of the array of data, each unit having a predetermined unit size in the first dimension corresponding to an integer number of a tile size in the first dimension of tiles of data; at an extremity of the array in the first dimension, reading a partial unit of data in a case that the array size in the first dimension of the array of the data is not an integer multiple of the unit size in the first dimension of the unit; filling data of the partial unit of data, at the compressor, to form filled data containing an integer number of tiles of data, compressing, at the compressor, the filled data on a tile-by-tile basis to form compressed data, and transferring the compressed data associated with the unit of data to the external storage.

According to a second aspect of the present disclosure there is provided a data processing system comprising: a processor comprising a local storage and a compressor, and an external storage, wherein data processing system is configured to perform a method of compressing data for transfer between the local storage and the external storage, wherein the data is part of an array of data of at least a portion of a layer of a neural network and has three or more dimensions, the method comprising: sequentially reading data stored in the local storage to the compressor in units of data along a first dimension of the array, each unit having a predetermined unit size in the first dimension corresponding to an integer number of a tile size in the first dimension of tiles of data; at an extremity of the array in the first dimension, reading a partial unit of data in a case that the array size in the first dimension of the array of the data is not an integer multiple of the unit size in the first dimension of the unit; filling data of the partial unit of data, at the compressor, to form filled data containing an integer number of tiles of data, compressing, at the compressor, the filled data on a tile-by-tile basis to form compressed data, and transferring the compressed data associated with the unit of data to the external storage.

According to a third aspect of the present disclosure there is provided a method of transferring compressed data between an external storage and a local storage of a processor, wherein the compressed data contains data, which is part of an array of data of at least part of a layer of a neural network and has three or more dimensions, the method comprising: obtaining dimensions of the array of data; sequentially reading compressed data associated with units of the array of data stored in the external storage; decompressing, by a decompressor, the read compressed data to obtain decompressed data, wherein decompressing includes discarding filled data that was filled into partial units of data during compression of the data on the basis of the obtained dimensions of the array of data; and writing the decompressed data to the local storage.

DETAILED DESCRIPTION OF THE INVENTION

Figure 1:
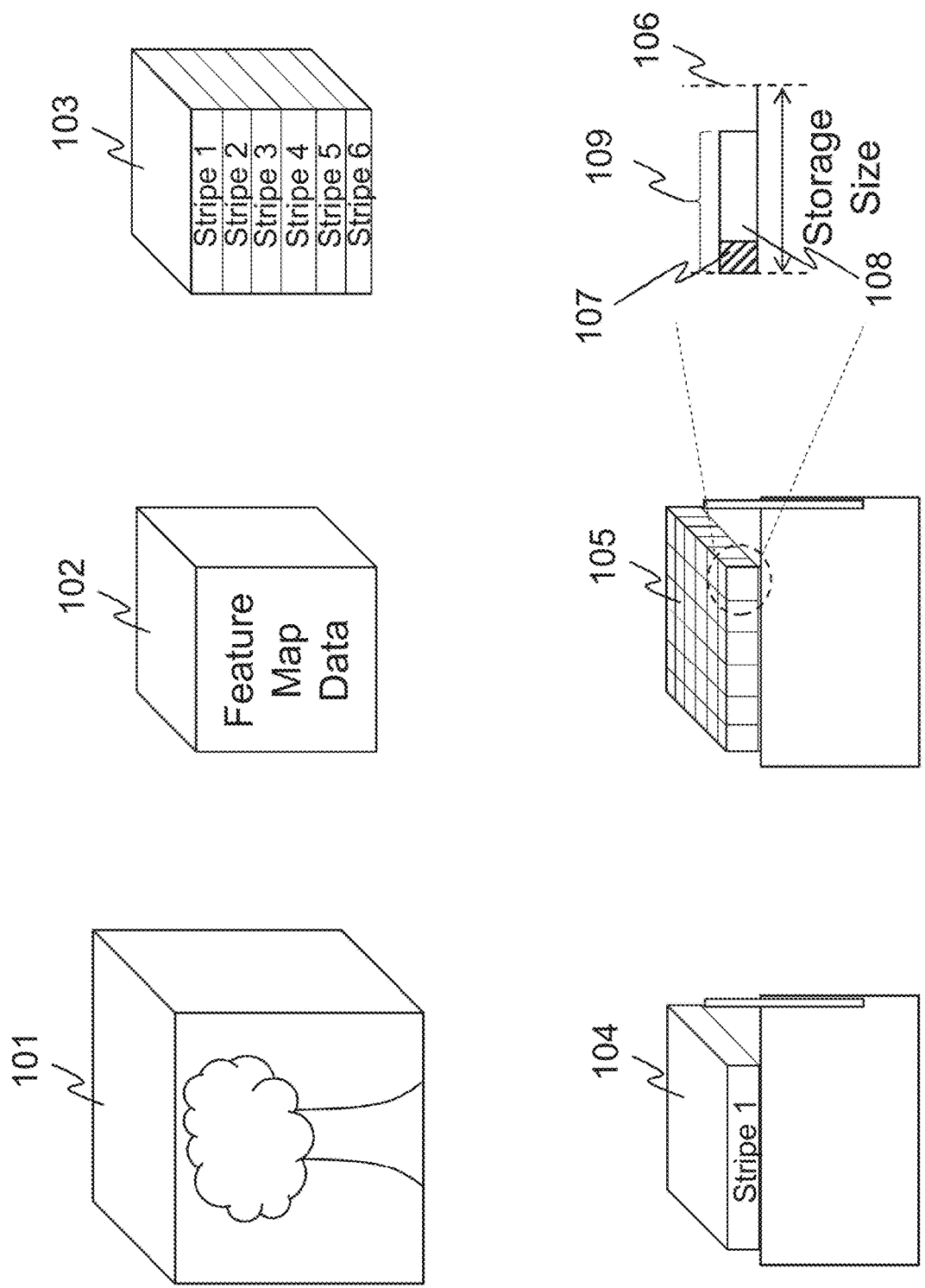
FIG. 1 illustrates a diagram of different types of feature map data at different stages of a data processing system processing a neural network in accordance with an example of the present disclosure.

Details of systems and methods according to examples will become apparent from the following description with reference to the figures. In this description, for the purposes of explanation, numerous specific details of certain examples are set forth. Reference in the specification to 'an example' or similar language means that a feature, structure, or characteristic described in connection with the example is included in at least that one example but not necessarily in other examples. It should be further noted that certain examples are described schematically with certain features omitted and/or necessarily simplified for the ease of explanation and understanding of the concepts underlying the examples. Herein, a computer-readable instruction, also referred to as an instruction, is a computer-readable instruction for one or more operations of processing circuitry.

Data processing systems which process neural networks, such as data processing systems comprising an NPU, typically comprise local storage circuitry and external storage circuitry. The local storage circuitry is used as a data buffer which temporarily stores data to be directly fetched for processing by processing circuitry and/or which temporarily stores data resulting from such processing. The external storage circuitry stores data which is to be transferred to and/or from the local storage circuitry. Typically, the external storage circuitry has a larger storage capacity than the local storage circuitry. In examples, the external storage circuitry has the capacity to store all of the input and/or output feature map data relating to a layer of the neural network while the local storage circuitry has the capacity to store only a portion of a layer's feature map data, at least in the case of some layers of a neural network.

The feature map data stored in the external circuitry to be transferred to the local storage circuitry in order to process a layer of the neural network is an input feature map (IFM). In examples, an IFM is stored in the form of feature map data representative of a feature map consisting of elements which have a height, width and depth (also known as channel) dimension. For example, a dimension of the feature map is its width. A part of the width dimension is a part of the feature maps width. The dimensions of a part of the feature map or a part of the feature map dimensions, may be smaller than the dimensions of the feature map. The dimensions of a subpart of the feature map or a subpart of the feature map dimensions, may be smaller than the dimensions of a part of the feature map. A dimension of a part of the feature map, such as the width dimension, may be smaller than the width dimension of the whole of the feature map. The IFM will be traversed by transferring feature map data from the external storage circuitry to the local storage circuitry and then processing the locally-stored feature map data using neural network processing. The feature map data comprises a plurality of elements which are used to represent corresponding elements of the feature map. In examples, the feature map is derived from an image, where the feature map data comprises elements which represent pixel values of the image. The height and width dimensions of the feature map are representative of the x and y coordinates of a pixel in the image. The depth dimension of the feature map is representative of multiple parameter values associated with each pixel, such as intensity values which make up the different color channels. The color channels combine to make up the image, depth data, etc. Feature map data representing an entire feature map may be split into portions which are subsets of the feature map data, each representing contiguous elements of a part of the feature map. In examples, the portion of feature map data is a stripe of feature map data. Herein, a stripe of feature map data is referred to as a stripe for conciseness. The stripe is a portion of feature map data which is transferred to the local storage circuitry for processing. The stripe of feature map data represents a part of the feature map with dimensions such that the local storage size of the stripe is less than or equal to the storage space of the local storage circuitry allocated for feature map data processing. After processing, the processed IFM stripes or output feature map (OFM) stripes will then be transferred to the external storage circuitry.

Reducing the number and/or rate of external memory accesses, which includes reading from and writing to the external storage circuitry during data transfer, will reduce the power consumption of the data processing system. This can be achieved through compressing the feature map data being transferred to the external storage circuitry and then decompressing the data being transferred to the local storage circuitry such that it can be processed. Compressing sets of feature map data results in corresponding sets of compressed feature map data of varying data amounts, as the different elements in each set of feature map data lead to a varying amount of compression. However, storing the sets of compressed feature map data in external storage circuitry in sequence contigually, with their varying storage data amounts, would result in a relatively large number and/or rate of memory access procedures compared with direct memory access in which the feature map data is transferred by accessing a set of known predetermined storage addresses directly.

The number and/or rate of external memory accesses can also be reduced by rearranging the order in which feature map data of the neural network is processed relative to the order in which the layers of the neural network are arranged. For example, once a first OFM stripe is produced from a first process and stored in the local storage circuitry, to avoid a series of memory accesses it may again be fetched for a second process instead of transferred to external storage. This occurs if the arrangement of the neural network indicates that a later layer would result in the first OFM stripe being processed by the second process. The second process may result in the second OFM stripe being arranged differently in the external storage circuitry relative to the initial arrangement of the feature map data. The initial arrangement of the feature map data in external storage circuitry corresponds to the represented feature map and its dimensions. A flexible processing order of the neural network therefore requires a flexible method of accessing the data and is incompatible with current methods used to compress feature map data due to the data being accessed in a fixed sequence. The examples demonstrated in this disclosure offer a solution to the discussed problem of using compression and decompression during the processing of a neural network by a data processing system.

FIG. 1 illustrates a diagram of different types of feature map data at different stages of a data processing system processing a neural network in accordance with an example of the present disclosure. In examples, the data processing system comprises an NPU. The NPU comprises local storage circuitry and processing circuitry. In examples, the local storage circuitry is static random access memory (SRAM). The data processing system also comprises external storage circuitry where data is stored to be transferred to the local storage circuitry for processing. In examples, the external storage circuitry is dynamic random access memory (DRAM). The neural network is a convolutional neural network (CNN) which comprises convolution layers. Image 101 is processed by the CNN to identify features. The image 101 has pixel values which can be represented in height, width and depth dimensions of a feature map. The depth dimension of the corresponding feature map represents color channel values which combine to construct the image. In examples, the color channels are expressed as RGB (red, blue and green) intensity values but may be color values in a different color model. The feature map is represented by feature map data 102 comprising elements which represent pixel values of the image 101. The feature map data 102 has the elements arranged in height, width and depth dimensions and has a data size which represents the amount of storage space needed to store the uncompressed feature map data 102 in storage circuitry. The data size of the feature map data 102 is related to the dimensions of the feature map represented by the feature map data 102.

In examples, the feature map has dimensions 32 (height)×32 (width)×64 (depth) which is represented by feature map data having a set of elements. Each element represents a pixel value of the image 101. The feature map dimensions represents how the pixels are arranged in the image 101. Each element has a data size of 8 bytes. The data size of the feature map data is therefore approximately 524 kilobytes.

In examples, the feature map data 102 is stored in DRAM and is an IFM. The feature map data 103 is broken down into a plurality of portions of feature map data which represent a part of the feature map having dimensions. In present examples, the portions of feature map data are stripes 103 the data sizes of which are determined by the storage capacity of the local storage circuitry or SRAM. It should be noted that although the demonstrated stripes are planar, in other examples, the stripes are taken vertically, from top to bottom. In examples, the represented part of the feature map dimensions and data size of each of the stripes 103 is identical. In examples, an IFM stripe is transferred to the SRAM for processing. From the processing, an OFM stripe 104 is generated and is temporarily stored in the SRAM. In examples, the IFM stripe is processed by convolving the IFM stripe with weight data to produce the OFM stripe 104. In other examples, processing the IFM stripe includes operating the IFM stripe with activation functions, pooling and deconvolution.

The OFM stripe 104 is transferred from the local storage circuitry to the external storage circuitry. In examples, this is achieved by using a direct memory access (DMA) which facilitates the reading and writing of data between the local storage circuitry and external storage circuitry. A portion of feature map data may be broken down further into units of feature map data. The OFM stripe 104 is transferred by being broken down into a set of units of the OFM stripe 105. Herein, units of feature map data are referred to as units for conciseness. The units 105 represent a subpart of the feature map dimensions where the dimensions in height, width and depth are determined by a predetermined format of subdivision. In examples, the predetermined format of subdivision is of certain dimensions, e.g. 8 h×16 w×16 d, and so each unit has elements which represent the subpart of feature map of the same dimensions. The units of the OFM stripe 105 each have a data size related to the represented subpart of the feature map.

The set of units 105 are compressed to produce a plurality of sections of compressed feature map data. In examples, a section of compressed feature map data 106 comprises a block of data 109. The block of data 109 comprises header data 107 and payload data 108. The payload data 108 comprises the compressed unit corresponding to the section of compressed feature map data 106. The header data 107 is indicative of one or more characteristics of the corresponding payload data 108.

In examples, each of the plurality of sections of compressed feature map data 106 has an equal external storage size, when stored in the external storage circuitry. The external storage size of the sections of compressed feature map data are at least equal to the combined data size of the header data 107 and the corresponding unit before it is compressed. This is so that the external storage size for each of the plurality of sections of compressed feature map data is large enough to contain payload data 108 even if it comprises an uncompressed unit. The external storage size for each of the plurality of the sections of compressed feature map data is equal even for varying blocks of data, data sizes. In other examples, the external storage size of the sections of compressed feature map data is selected to be equal to or larger than the combined data size of a minimum amount of header data 107 used to represent uncompressed unit, and the full data size of a corresponding unit before it is compressed. This is to ensure the combined data size of the header data and payload data never exceeds the external storage size of the section of compressed feature map data. The external storage size of the section of compressed feature map data may be larger than the combined data size of the header data 107 and payload data 108. Each of the sections of compressed feature map data has a constant external storage size as discussed previously such that each the plurality of sections of compressed feature map data have the same storage size. In examples, the sections of compressed feature map data when stored in external storage circuitry comprise a portion of storage size which is devoid of data. In other examples, the sections of compressed feature map data comprise a portion of storage size which contains zero-value data which is not accessed for transfer.

The external storage size of each of the plurality of sections of compressed feature map data 106 corresponds with an equal amount of associated allocated storage space in the external storage circuitry referred to herein as a "cell". Each of the plurality of cells in the external storage circuitry has an identical storage space equal to the external storage size of one of the plurality of sections of compressed feature map data such that the section of compressed feature map data can be stored in the cell in the external storage circuitry.

Figure 2:
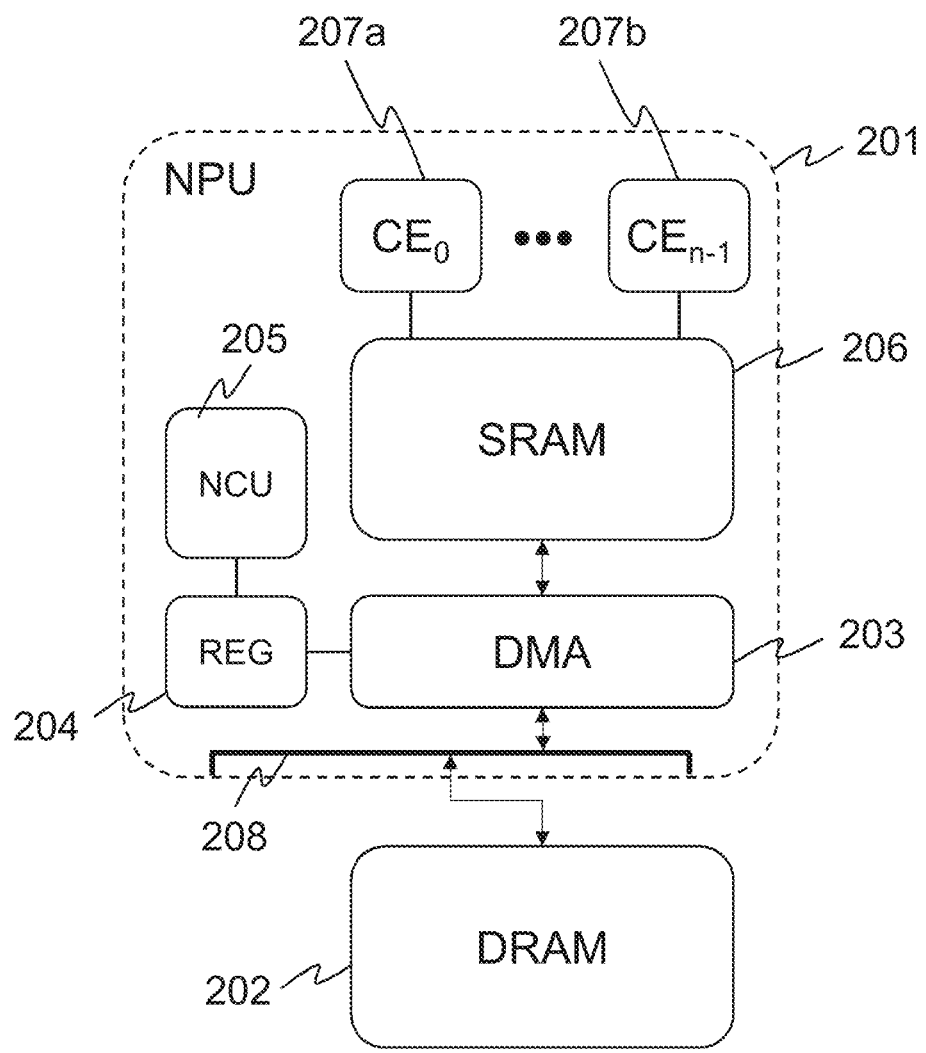
FIG. 2 illustrates a schematic block diagram representing a data processing system comprising an NPU and external storage circuitry in accordance with an example of the present disclosure.

FIG. 2 illustrates a schematic block diagram representing a data processing system comprising an NPU and external storage circuitry in accordance with an example of the present disclosure. The data processing system has external storage circuitry which is DRAM 202. The DRAM 202 is used to store feature map data and other data associated with the neural network such as weight data and instructions. The feature map data may be IFMs, OFMs, IFM stripes, OFM stripes, units of IFM stripes, units of OFM stripes and sections of compressed feature map data. The DRAM 202 is connected to the NPU 201 by a data transfer interface such as system bus 208. The NPU 201 comprises a DMA 203 which is connected to the DRAM 202 via the system bus 208 and SRAM 206 via a main data channel. The DMA 203 facilitates the reading and writing of data between the external DRAM 202 and SRAM 206. The SRAM 206 is used to store feature map data in the form of IFM stripes to be processed and OFM stripes after processing and other data associated with processing such as weight data, activation functions and pooling operations. The DMA also has a register 204 which can be set by a neural control unit (NCU) 205. The register 204 comprises a memory address register, byte count register and one or more control registers which are used to specify the source, destination, direction and the amount of the data transfer. The NCU generates control data for the hardware components of the NPU 201, such as the DMA 203 and compute engines 207a, 207b. In examples, other types of processing circuitry are used in place of the NCU, such as a CPU or GPU. The SRAM 206 is connected to a plurality of compute engines 207a, 207b. The compute engines 207a, 207b comprise multiply accumulate (MAC) compute engines (MCE) and programmable layer engines (PLE). MCEs are configured to perform convolutions between an IFM and weight data to generate an OFM. These convolutions may be broken down into IFM stripes and convolved with weight data to generate OFM stripes as discussed previously. PLEs are arranged to perform additional processing operations of the IFM, OFM, IFM stripes or OFM stripes including pool operations and applying activation functions. The PLE can also be programmed to perform a number of operations on different layers of the CNN, allowing for a broad range of CNN architectures to be implemented. In examples, the data processing system is configured for parallel processing. The SRAM 206 is configured to transfer feature map data for processing from a plurality of data buffers equal to the number of compute engines 207a, 207b with the DMA 203 configured to transfer the data to the plurality of data buffers.

Figure 3:
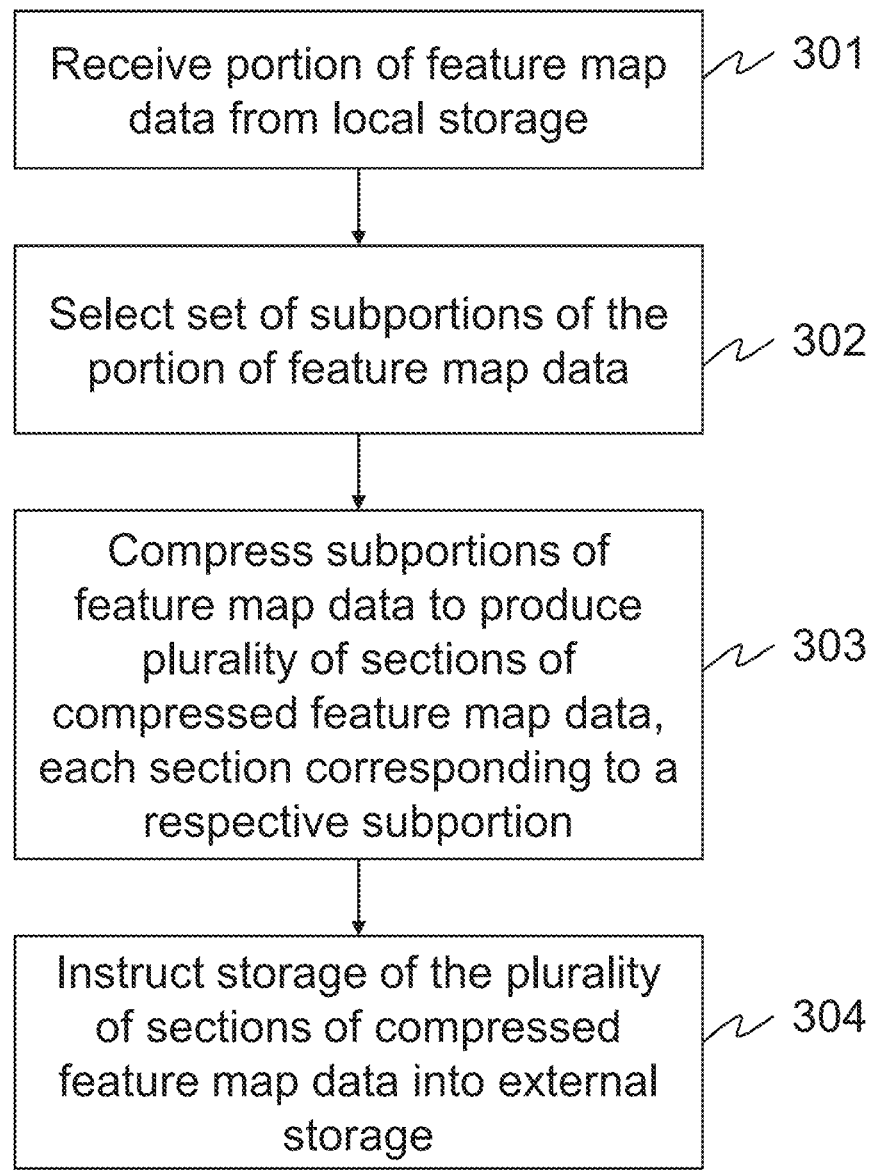
FIG. 3 illustrates a flow diagram representing a method of storing feature map data of a neural network in accordance with an example of the present disclosure.

FIG. 3 illustrates a flow diagram representing a method of storing feature map data of a neural network in accordance with an example of the present disclosure. The example concerns processing of a convolution layer, but other implementations may use other neural network layers, such as deconvolution layers. In examples the neural network is processed using the data processing system previously conferred in the discussion of FIG. 2. At step 301 of the flow diagram a portion of feature map data is received from local storage circuitry. In examples, the portion of feature map data is an OFM stripe, generated by processing an IFM stripe of an earlier neural network layer. The OFM stripe is received by a DMA. The DMA facilitates the reading and writing of data between the DRAM and SRAM via the use of a main data channel. At step 302 of the flow diagram a set of units of the portion of feature map data is selected by the DMA. As demonstrated by FIG. 1, the OFM stripe 104 is broken down into a set of units 105. The units comprise subdivisions of contiguous elements of the stripe. The units 105 each represent a subpart of the feature map which corresponds to a predetermined format of subdivision. The predetermined format of subdivision is used to determine the height, width and depth of the subpart feature map represented by the units 105. The predetermined format of subdivision is selected from a plurality of predetermined formats of subdivision.

At step 303 of the flow diagram the units are compressed by the DMA to produce a plurality of sections of compressed feature map data, each section corresponding to a respective unit. A unit of feature map data is compressed using one or more compression techniques or methods to reduce the amount of data which is written to and read from external storage. In examples, the one or more compression techniques comprise lossless compression, but in other examples a lossy compression scheme could be used. Lossless compression ensures that no data is lost during compression such that on decompression the data can be restored to its original state. In examples, lossless compression comprises lossless variable length coding (VLC) such as Huffman encoding. In examples, the one or more compression techniques comprise removing zero-value elements from the unit of feature map data. In other examples, the one or more compression techniques comprise dividing all elements in the unit of feature map data by a common divisor. As demonstrated by FIG. 1, compressing the unit of feature map data produces a block of data 109 which comprises payload data 108. The payload data 108 comprises the compressed unit. In examples, the block of data also comprises additional data such as header data 107 which is generated by the DMA during the compression of the unit. The header data 107 comprises data associated with the properties of the payload data 108. The header data 107 is used during the transfer of the sections of compressed feature map data. In examples, the header data 107 may comprise one or more uncompressed indicators which indicate if and where the payload data 108 comprises contiguous regions of uncompressed elements. The header data also comprises a data element indicative of the data size of the payload data 108.

At step 304 of the flow diagram the DMA instructs the storage of the plurality of sections of compressed feature map data into external storage. Each of the plurality of sections of compressed feature map data has a corresponding cell in the external storage circuitry. The cells have an allocated storage space equal to the external storage size of each section of compressed feature map data. The plurality of cells each have equal storage space. In examples, the DMA instructs the storage of the plurality of sections of feature map data into the plurality of cells in the DRAM by transferring the sections of compressed feature map data using a data stream. The data stream comprises a sequence of the plurality of header data and corresponding payload data of variable data size. Each of the payload data comprises compressed units which have variable data sizes corresponding to how much the units were compressed during compression. In examples, the sequence of the header data and payload data in the data stream is different to the order in which the DMA received the header data and payload data. The data stream ensures that the associated external storage size of each section of compressed feature map data is used to store the corresponding header data and payload data for each of the plurality of sections of compressed feature map data in cells in the external storage circuitry.

In examples, this method can be used to transfer an OFM stripe stored in the local storage to the external storage where it is stored. The OFM stripe related to one neural network layer is stored in the external storage where it is transferred back to the local storage to be processed as an IFM stripe of a different neural network layer.

Figure 4:
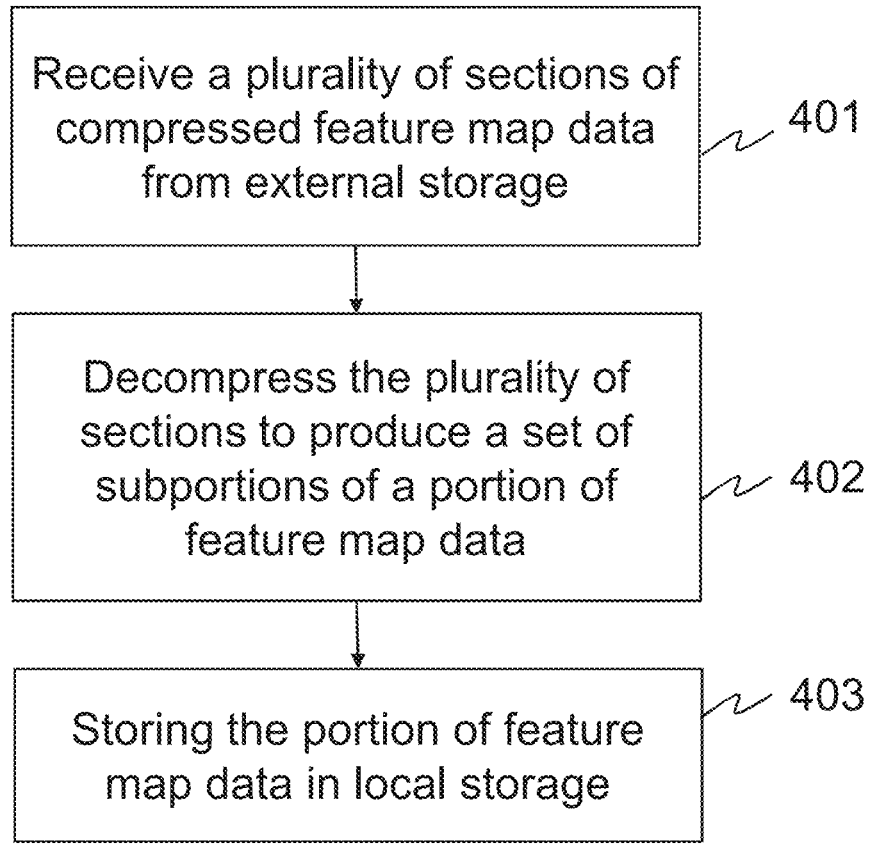
FIG. 4 illustrates a flow diagram representing a method of receiving feature map data of a neural network in accordance with an example of the present disclosure.

FIG. 4 illustrates a flow diagram representing a method of receiving feature map data of a neural network in accordance with an example of the present disclosure. In examples, the neural network is processed using the data processing system previously discussed in FIG. 2. At step 401 of the flow diagram the DMA receives a plurality of sections of compressed feature map data from external storage. In examples, the sections of compressed feature map data were previously stored in cells in the external storage circuitry using the method demonstrated in the discussion of FIG. 3. In other examples, the plurality of sections of compressed feature map data to be received from the external storage represent a different respective part of the feature map to the plurality of sections of compressed feature map data which were previously transferred to the external storage circuitry from the local storage circuitry. In examples, the DMA may retrieve the plurality of sections of compressed feature map data by instructing the DRAM to transfer of the plurality of sections of compressed feature map data in a data stream as previously discussed.

In examples, the DMA retrieves the sections of compressed feature map data from the external storage circuitry using the address data within the header data. The address data represents addresses of the plurality of units contained in the sections of compressed feature map data. The addresses correspond to the location of the subparts of the feature map which the units represent within the feature map. The addresses may be used by the DMA to receive the sections of the compressed feature map data in the same order as the units are found in the part of the feature map which they represent.

At step 402 the DMA decompresses the plurality of sections of feature map data to produce a set of units of a portion of feature map data. In examples, the plurality of sections of feature map data comprise a corresponding plurality of blocks of data. The blocks of data comprise payload data and header data. As demonstrated by FIG. 1, the header data 107 precedes the payload data 108 such that the header data 107 is read before the payload data 108. As discussed previously, the header data comprises a data element indicative of the data size of the payload data comprising the section of compressed feature map data. This indicates to the DMA, how much of the section of compressed feature map data to read, to retrieve the payload data for decompression. The data element is used to ensure that the payload data is read for decompression. In examples the header data comprises compression data which indicates how the payload data comprising compressed units was compressed. The compression data is used to inform the decompression process of the payload data to produce the corresponding unit data. The produced plurality of units will be identical to the plurality of units which were initially compressed during the transfer of the plurality of units to the external storage circuitry. This is due the use of lossless compression techniques. In examples, the one or more compression techniques comprise the removal of zero-value elements from the units of feature map data to produce compressed feature map data during compression. The header data comprises compression data indicating where zero-value elements are to be returned to the payload data during the decompression.

In some implementations, the feature map data may also include a zero-point, which is a parameter of the feature map data that indicates a value within the feature map data that is considered as the zero value. In this way, the zero-point may vary from network-to-network and implementation-to-implementation. In some implementations, the zero-point can be set for the entire neural network. In other implementations, different zero-point values may be set within some layers or each layer of the neural network. In yet further implementations, there may be a different zero-point value set for each channel (depth) in one or more layers. The selection of the value of the zero-point can lead to efficient compression of the feature map data by introducing more zero (or low) values in the feature map data that can be efficiently compressed using variable length codes or zero-run encoding.

At step 403 the DMA stores the portion of feature map data in local storage. The DMA ensures that the units of feature map data produced from decompressing the payload data are written to the SRAM in an order such that they combine to form the IFM stripe in the SRAM which is then fetched for processing. This may be achieved using address data.

Figure 5:
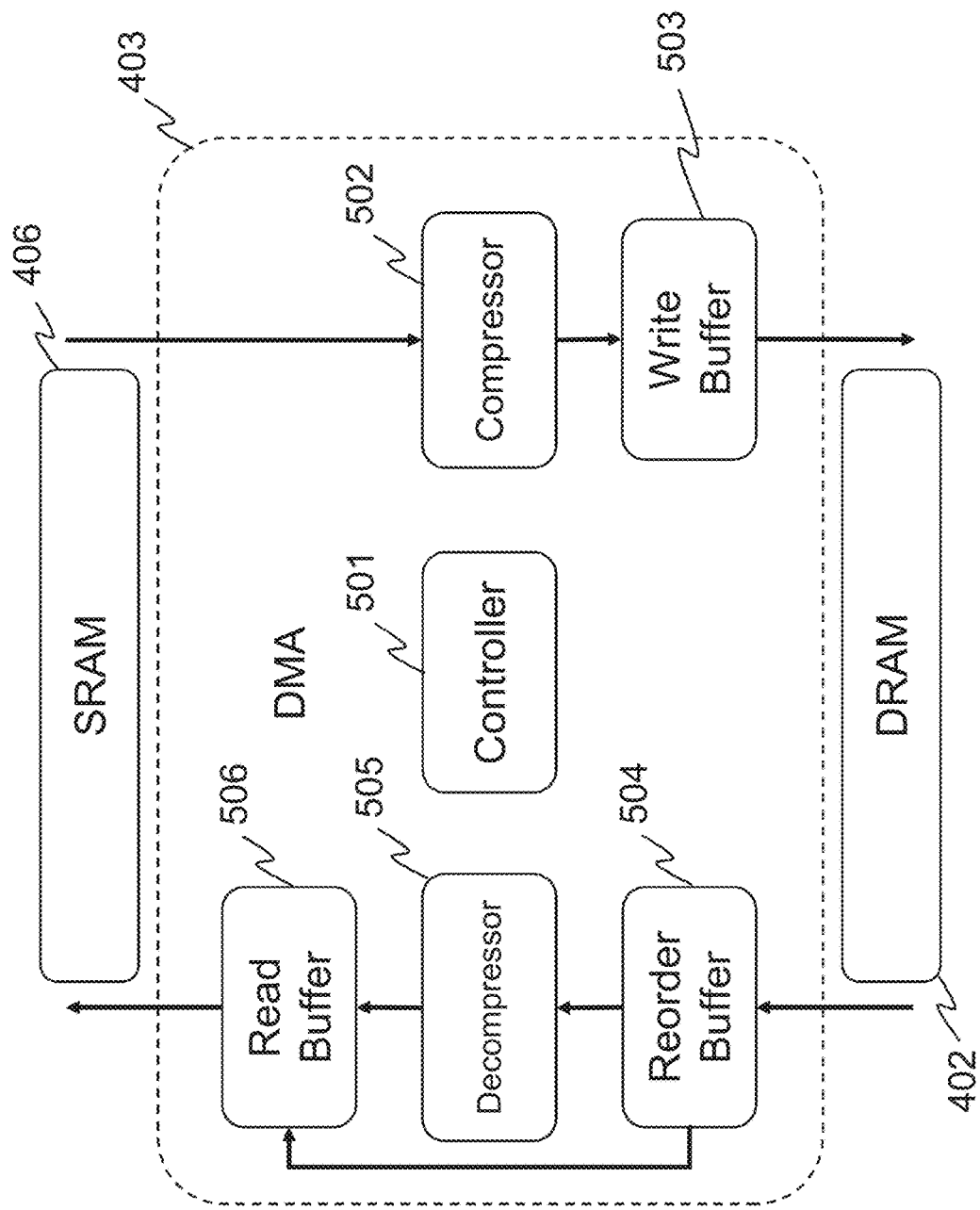
FIG. 5 illustrates a schematic block diagram representing storage circuitry comprising a compressor and a decompressor in accordance with an example of the present disclosure.

FIG. 5 illustrates a schematic block diagram representing storage circuitry comprising a compressor and a decompressor in accordance with an example of the present disclosure. In examples, the storage circuitry is a DMA. In examples, the DMA 403 is contained within the data processing system discussed previously in FIG. 2. The DMA 403 comprises a controller 501 which generates control data for the hardware components of the DMA 403. In examples, the controller 501 generates control data according to control data generated by the NCU.

The controller 501 generates control data for the DMA 403 to receive feature map data from the SRAM 406. In examples, the feature map data being received from the SRAM 406 is an OFM stripe. The OFM stripe is retrieved from the SRAM 406 and transferred to the compressor 502. In examples, the compressor comprises a compressor buffer where the OFM stripe is split into a plurality of units of feature map data representing subparts of the feature map with equal dimensions. Each unit of feature map data may be given a corresponding address by the DMA which is generated from the position of the subpart of the feature map within the feature map which the unit represents. The address is used to recall the unit of feature map data and related feature map data types such as corresponding sections of compressed feature map data.

Each of the plurality of units of feature map data represents a subpart of a feature map with height, width and depth dimensions. The represented subpart of the feature map dimension is equal for each unit of feature map data with each unit representing a different subpart of the feature map. The represented subpart of the feature map is selected using a predetermined format of subdivision. This predetermined format of subdivision is selected using software which is executed by the data processing system prior to the processing of the neural network. The software when executed by a processor selects the predetermined format of subdivision based on a property of the neural network layer associated with the feature map data being transferred. In examples, the software, when executed by a processor, selects a predetermined format of subdivision based on the predetermined dimensions of a selection of OFM data of the neural network layer. The selection of OFM data is an OFM stripe which represents a portion of an output feature map with dimensions, the output feature map resulting from a feature map being processed. The represented portion of output feature map corresponds to the storage size of the OFM stripe. In a further example, the software, when executed by the processor, selects the predetermined format of subdivision based on the position of the layer being processed in a sequence of layers. The neural network comprises the sequence of layers.

In examples, the neural network is processed by the data processing system by executing a set of instructions where an instruction implements a layer of the neural network. The set of instructions has a sequence which is used to determine the sequence of neural network layers in the neural network. It should be noted that even if the neural network layers are processed out of order, the initial position of the neural network layer in the set of instructions is used to select the predetermined format of subdivision. Earlier layers of neural networks have feature map data which represents a part of the feature map that is shallow, wide and deep and later layers of neural networks have feature map data which represents a part of the feature map which is shallow and thin but deeper than the dimensions of feature maps of earlier layers.

In examples, the software used to select the predetermined format of subdivision is a compiler. The compiler processes source code or assembly code implementing a neural network with layers to determine a set of instructions used by hardware components to carry out processes during clock cycles of the data processing system. The set of instructions comprise instructions related to each layer of the neural network. The instructions related to each layer of the neural network are used by the hardware components of the data processing system, such as the DMA, to schedule the transfer of the feature map data between local storage and external storage during the processing of the layer of the neural network. In examples, the instructions related to each layer of the neural network comprise subdivision parameters indicating the selected predetermined format of subdivision for the layer of the neural network. The subdivision parameters are used by the DMA to determine the dimensions of the subpart of the feature map which the units represent. This also determines the storage size of the units of feature map data as the represented dimensions of the subpart of the feature map are related to the storage size of the units.

The plurality of units are compressed using the compressor 502 to generate a plurality of sections of compressed feature map data in which each section of compressed feature map data corresponds to a unit. The plurality of sections of compressed feature map data comprise a plurality of header data with each header data corresponding to a section of compressed feature map data. The plurality of sections of compressed feature map data also comprise a plurality of payload data. The payload data comprises the corresponding compressed units. The payload data and corresponding header data form a block of data. The compressor generates the sections of compressed feature map data such that they have a storage size which is larger than the combined data size of the header data and unit of compressed feature map data before compression. Each of the plurality of sections of compressed feature map data have equal storage size. The header data comprises a data element indicating the data size of the corresponding payload data. The header data also comprises an uncompressed indicator which indicates contiguous portions of uncompressed feature map data within the payload data. The header data further comprises address data corresponding to the position of the subpart of the feature map within the feature map representing the unit of feature map data. The header data also comprises compression data corresponding to the one or more compression techniques used to produce the payload data. The compression data is used to decompress the payload data when it is transferred to the decompressor.

The plurality of sections of compressed feature map data are then transferred to the write buffer 503. The write buffer 503 generates a data stream comprising a sequence of header data and payload data which is used to write the plurality of sections of compressed feature map data to the DRAM 402. In examples, the write buffer 503 writes the plurality of sections of compressed feature map data into a plurality of cells within the DRAM 402. Each of the plurality of cells has a storage space equal to the storage size of each of the plurality of sections of compressed feature map data.

The controller 501 generates control data to receive feature map data from the DRAM 402. In examples, the received feature map data is an IFM stripe comprising of a plurality of sections of compressed feature map data. As discussed previously, the plurality of sections of compressed feature map data can originate from an OFM stripe of a previous layer of the neural network transferred from the SRAM 406. The OFM stripe of a previous layer of the neural network can be an IFM stripe of a later layer of the neural network within the sequence of layers of the neural network. The plurality of sections of compressed feature map data may also correspond to initial feature map data representing the initial feature map input into the neural network. In examples, an IFM stripe comprising a portion of the initial feature map data is compressed to generate the plurality of sections of compressed feature map data externally to the data processing system and transferred to the DRAM 402 by a computer communicatively coupled to the data processing system.

In examples, the plurality of sections of compressed feature map data is stored in the DRAM 402 in a plurality of cells. The controller 501 instructs the transfer of the plurality of sections of compressed feature map data from the plurality of cells within the DRAM 402 to the decompressor 505 in a data stream comprising a sequence header data and payload data, as discussed previously. The data stream is used to read the sections of compressed feature map data from the DRAM 402 and transfer it to the decompressor 505.

Figure 6:
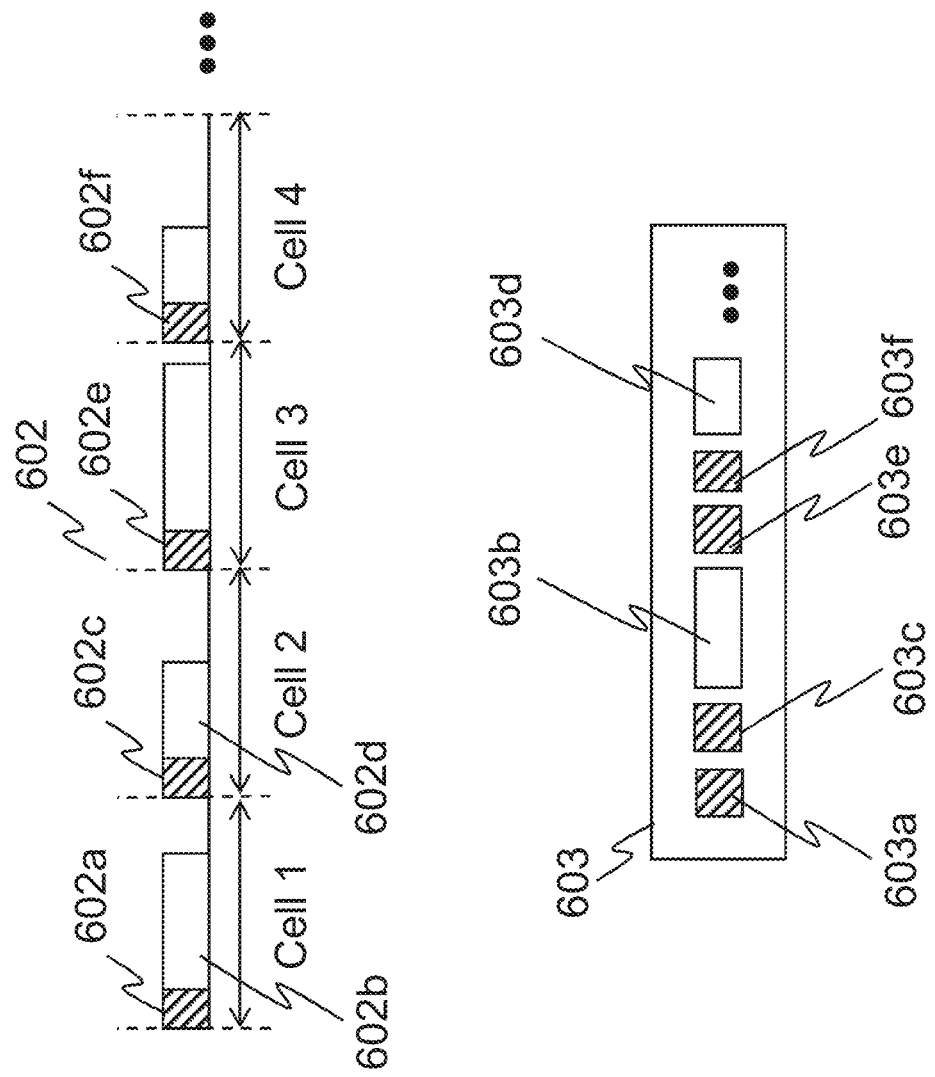
FIG. 6 illustrates a schematic block diagram representing a method of transferring feature map data from DRAM to SRAM in accordance with an example of the present disclosure.

FIG. 6 illustrates a schematic block diagram representing a method of transferring feature map data from DRAM to SRAM in accordance with an example of the present disclosure. The cell arrangement 602 demonstrates a representation of the sections of compressed feature map data stored in cells which contain the sections of compressed feature map data in the external storage circuitry. Each of the plurality of sections of compressed feature map data comprise header data 602a, 602c, 602e, 602f and corresponding payload data 602b, 602d which form blocks of data. The payload data is variable in data size due to the varying degrees of compression. The sections of compressed feature map data may each have a storage size which is larger than the data size of the corresponding block of data, as shown in FIG. 6. Each of the cells have a storage space equal to the storage size of the sections of compressed feature map data. The sections of compressed feature map data when stored in the cells comprise a portion of storage size which is devoid of data which is not transferred in the data transfer process.

The sections of compressed feature map data contained in the cell arrangement 602 is transferred to the reorder buffer 504 of FIG. 5 across a data transfer interface such as a system bus. The reorder buffer 504 uses the cell arrangement 602 to produce a data stream 603. The data stream 603 comprises a sequence of blocks of data with variable sizes. The reorder buffer 504 uses the data element indicative of the data size of the payload data within the header data to ensure that the data stream comprises only of the header data and payload data where the total data size of the data stream is equal to the combined data size of the plurality of header data and payload data as indicated by the data stream 603 of FIG. 6. In examples, the portion of storage size which is devoid of data contained within the cell is not transferred in the data stream.

The reorder buffer 504 is also used to reorder the header data and payload data from the cell arrangement 602 in the data stream 603. There is a long latency associated with reading data from the DRAM which can be hundreds of clock cycles long. The reorder buffer 504 arranges the sequence of the header data and payload data in the data stream 603 such that a sequence of consecutive header data can be read during long latency periods so that clock cycles are not wasted. As indicated in the data stream 603 of FIG. 6, the header data and payload data in the cell arrangement 602 are rearranged by the reorder buffer 504 such that the header data 603*a* of cell 1 and the header data 602*c* of cell 2 precede the payload data 602*b* of cell 1 and the header data 603*e* of cell 3 and the header data 602*f* of cell 4 precede the payload data 602*d* of cell 2. This is so that the latency period associated with reading the payload data 603*b* of cell 1 is utilized by reading the header data 603*a* of cell 1 and header data 603*c* of cell 2. The latency associated with reading the compressed feature map data 603*d* of cell 2 is also utilized by reading the header data 603*e* of cell 3 and header data 603*f* of cell 4.

In examples, the data stream 603 comprises a consecutive sequence of a larger number of header data between each payload data than demonstrated in FIG. 6. In other examples, the data stream 603 comprises a consecutive sequence of a higher number of header data at the start of the reordered data stream relative to the consecutive sequence of header data read between each payload. This is to ensure that the read header data is always ahead of the payload data. In further examples, the reordered data stream comprises a consecutive sequence of header data followed by a consecutive sequence of payload data. In other examples, the data stream comprises a sequence of 3 header data followed by 3 payload data.

As demonstrated by FIG. 5, the reorder buffer 504 uses the uncompressed indicators within the header data to determine if the corresponding payload data comprises a unit of feature map data which has not been compressed so that the payload data can be rerouted past the decompressor 505 to the read buffer 506. In examples, this may be achieved using a data stream comprising the header data and payload data of uncompressed feature map data. As demonstrated by FIG. 5 and FIG. 6 the data stream 603 is used to transfer the header data and corresponding payload data from the DRAM 402 to the decompressor 505 where it is decompressed. The decompressor uses compression data which is related to the compression of the compressed feature map data within the header data to determine how to decompress the compressed feature map data to produce the corresponding unit which is then transferred to the read buffer 506. The decompressor 505 also uses the address data within the header data to ensure the units are transferred to the SRAM in an order such as to construct the IFM stripe. In examples, the units are reordered in the read buffer 506. The plurality of units are transferred from the read buffer 506 to the SRAM 406 such that the IFM stripe is stored in the SRAM 406 for processing.

Figure 7:
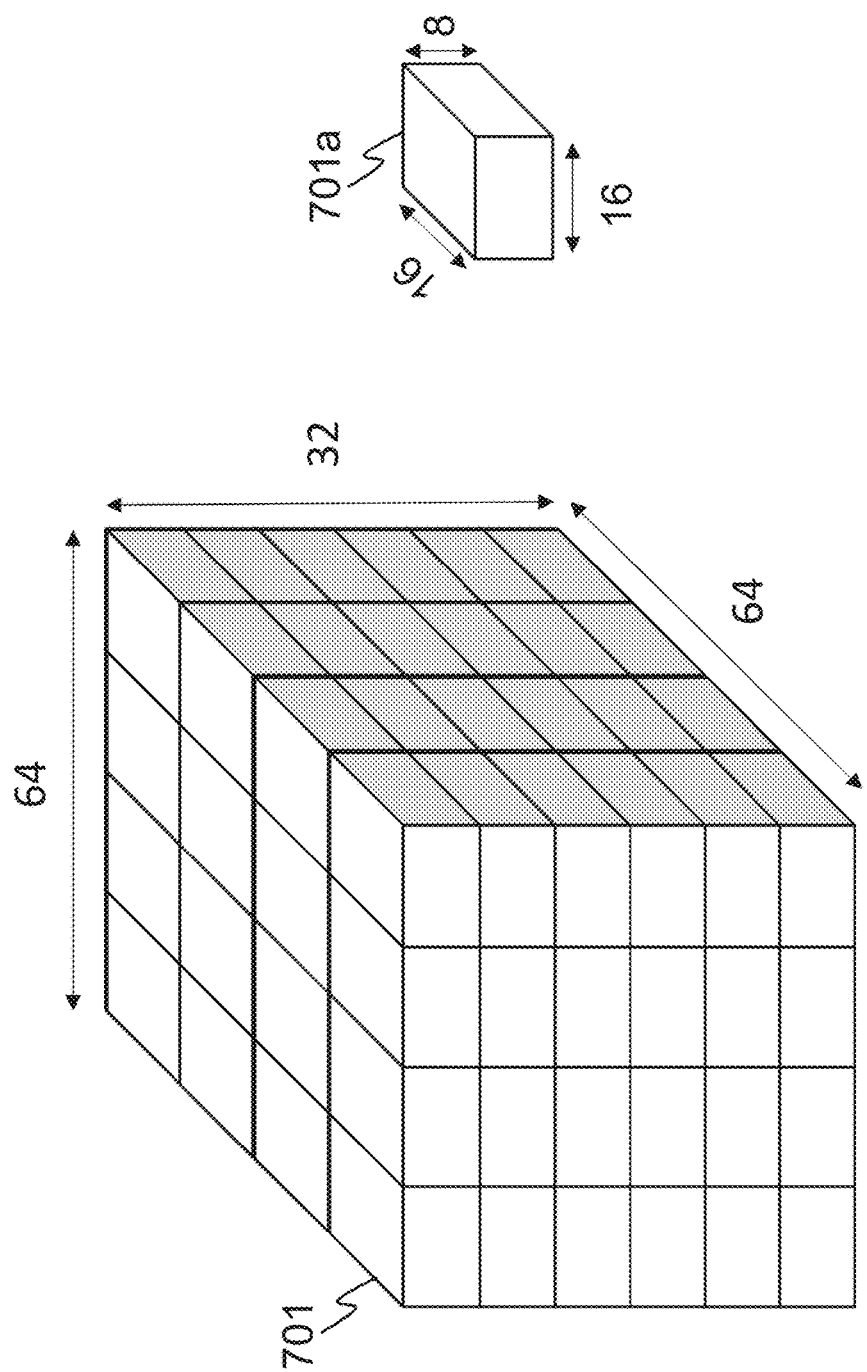
FIG. 7 illustrates a diagram representing a part of a first feature map and a first predetermined format of subdivision in accordance with an example of the present disclosure.

FIG. 7 illustrates a diagram representing a part of a feature map and a first predetermined format of subdivision in accordance with an example of the present disclosure. A part of a feature map 701 has dimensions of e.g. 32 h×64 w×64 d and is represented by a portion of feature map data. As discussed previously, the portion of feature map data representing the part of the feature map is broken down into units of feature map data using a predetermined format of subdivision which is selected from a plurality of predetermined formats of subdivision. Each of the plurality of predetermined formats of subdivision has dimensions representative of a subpart of the feature map.

If a dimension of the predetermined format is not selected appropriately, the part of the feature map for a layer of the neural network may have units of feature map data which represent only a small number of elements at the extremities of each part of the feature map. This is because the dimensions of the part of the feature map may not be completely divisible by the selected predetermined format of subdivision. During the data transfer process discussed previously, the units of feature map data are compressed to produce sections of compressed feature map data which are stored in cells in external storage circuitry. The sections of compressed feature map data which comprise only a small number of elements when transferred by the data processing system cause it to consume a large amount of power relative to the amount of data transferred. The plurality of predetermined formats of subdivision may be determined through modelling the processing of the neural network by the data processing system, with different formats of subdivision and selecting the formats of subdivision which reduce the amount of power consumed by the data processing system.

In examples, the plurality of predetermined formats of subdivisions comprise a wide format 701*a*. Each unit of feature map data in the wide format 701*a* has dimensions of e.g. 8 h×16 w×16 d. The part of the feature map 701 with dimensions of e.g. 32 h×64 w×64 d is therefore represented by a given number of, e.g. 96 units using this predetermined format of subdivision. The wide format is used for earlier neural network layers of the neural network where the feature map data is shallow, wide and deep.

Figure 8:
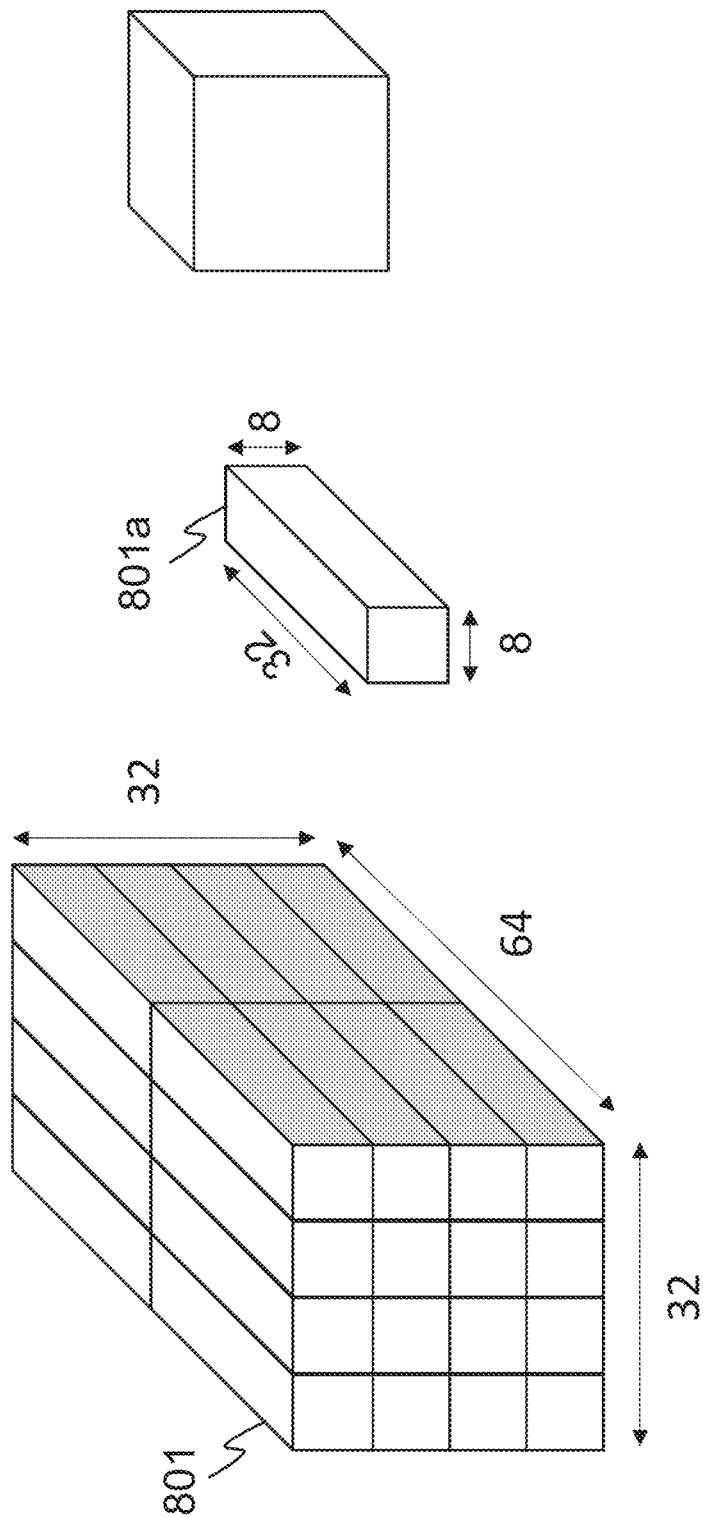
FIG. 8 illustrates a diagram representing a part of a first feature map and a second predetermined format of subdivision in accordance with an example of the present disclosure

FIG. 8 illustrates a diagram representing a feature map and a second predetermined format of subdivision in accordance with an example of the present disclosure. A part of a feature map 801 has dimensions of e.g. 32 h×32 w×64 d and is represented by a portion of feature map data. In examples, the plurality of predetermined formats of subdivisions comprise a deep format 801*a*. Each unit of feature map data in the deep format 801*a* represents a subpart of the feature map with dimensions of e.g. 8 h×8 w×32 d. The part of the feature map 801 with dimensions of e.g. 32 h×64 w×64 d is therefore represented by a given number of, e.g. 32, units with this predefined format of subdivision. This is less than the number of units used for earlier layers. The deep format is used for later neural network layers of the neural network where the feature map is shallow and thin, but deeper relative to feature maps of earlier layers of the neural network.

The subsections of compressed feature map data and corresponding cells provide a unitary storage size and storage space to/from which data can be transferred flexibly. Even though the blocks of data comprising the sections of compressed feature map data are of a variable data size, because they are contained within sections of compressed feature map data with the same fixed storage size and then stored in cells which have a fixed storage space, each block of data can be arranged flexibly in storage circuitry to be accessed in a sequence. Compressed feature map data arranged in the external storage circuitry without the use of unitary storage sizes has an arrangement which is costly in terms of the number of memory accesses which are used to retrieve it in a sequence. By arranging the compressed feature map data in unitary storage spaces, the number of memory accesses is reduced. The unitary storage size also allows parts of the feature map to be retrieved and processed flexibly. This reduces the memory bandwidth used by a data processing system to process a neural network.

Partial Units

As noted above, if the feature map data that is being transferred between the SRAM 406 and the DRAM 402 has dimensions which are not a multiple of an available format of subdivision then compressing feature map data at the extremities of the feature map is less resource efficient because the data comprises only a small number of elements that, when transferred by the data processing system, cause it to consume a large amount of power relative to the amount of data transferred. Various steps may be taken to avoid using more power than necessary.

Before explaining partial units, some additional detail of the compression applied by the compressor 502 and corresponding decompression by the decompressor 505 is appropriate. The uncompressed feature map data is grouped into 8 by 8 groups of elements referred to as tiles. A data element within a tile is an 8-bit uncompressed activation data value forming part of the feature map. The 8-bit uncompressed activation data values are compressed by the compressor 502 using a compression scheme that compresses the 8 by 8 tiles of data using variable length codes, such as Golomb-Rice codes. The compression scheme is not described here in detail as its details are not important. As described before, any suitable compression scheme, such as delta encoding, zero-run encoding, etc. could be used on each tile of feature map data. The compression is performed on a tile-by-tile basis by the compressor 502 and decompression is performed on a tile-by-tile basis by the decompressor 505.

It is noted that the formats of subdivision described above make use of integer multiples of the tiles. For example, the wide format 701a of subdivision illustrated in FIG. 7 has a section of 8 h×16 w, which is two tiles, and the deep format 801a of subdivision illustrated in FIG. 8 has a section of one tile. When using the wide format 701a, the feature map data is read out tile-by-tile. In other words, the left-side tile of 8 by 8 elements is read out and then the right-side tile of 8 by 8 elements is read out. This process is repeated in a depth dimension through the unit.

Figure 9:
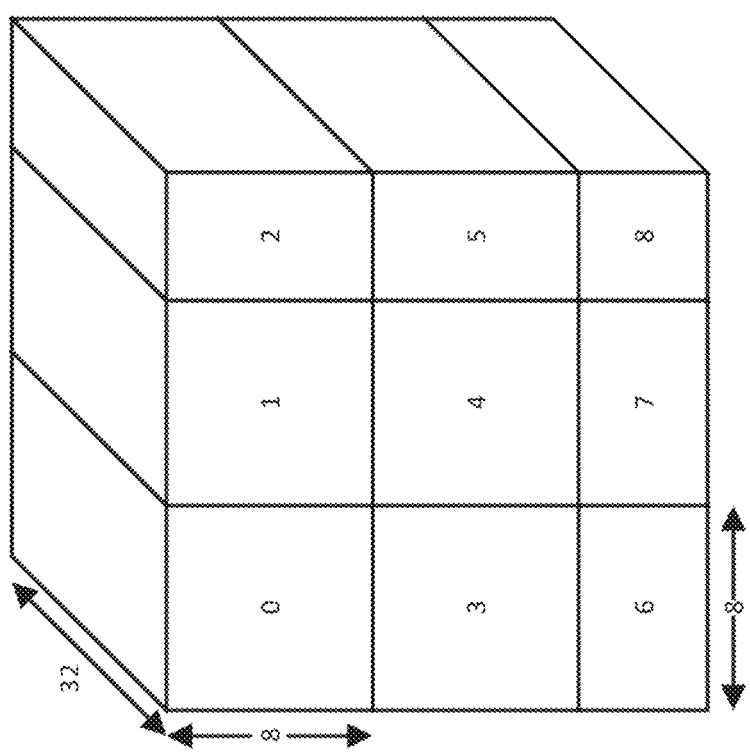
FIG. 9 is a diagram representing a second feature map divided according to the first predetermined format of subdivision.

FIG. 9 shows a feature map that has uncompressed dimensions of 21 h×21 w×32 d. The feature map is to be compressed using the deep format 801a of subdivision (8 h×8 w×32 d). As can be seen in FIG. 9, when traversing the feature map from the near top-left corner, complete units of dimensions 8 h×8 w×32 d labelled units 0, 1, 3 and 4 can be formed. These units are compressed by the compressor 502 and stored in corresponding cells in the DRAM 402 as previously described. As the feature map has a depth of 32 data elements, which is the same as the depth of the unit in the deep format of subdivision, the feature map is completely covered in the depth dimension. However, the feature map has data elements at extremities of the feature map data around complete units 0, 1, 3 and 4 in the height and width dimensions that do not form complete units of feature map data according to the deep format of subdivision 801a. Two partial units of feature map data 2 and 5 have a partial width, two partial units of feature map data 6 and 7 have a partial height and one partial unit 8 of feature map has a partial width and a partial height.

In this example, using the deep format of subdivision 801a, when a partial unit is reached when traversing the feature map data, the feature map data corresponding to the partial unit is read from the SRAM 406 sequentially in the depth dimension. For the unit 6 in FIG. 9, partial tiles of data of dimensions 5 h×8 w are read out sequentially along the depth dimension. As each partial tile of data is read by the compressor 502, the compressor fills the partial tile of data to form a complete tile of data (8×8) by filling in zero-point values for the bottom of each partial tile to complete the tile of data. The, now complete, tiles of feature map data are then compressed tile-by-tile using the compression scheme. The compressed data corresponding to the unit of data 6 is transferred to the DRAM 402 and stored in a cell as previously described.

The partial unit of feature map data 7 shown in FIG. 9 has the same dimensions as partial unit 6 and the same process described above is followed.

On the other side of the feature map data, partial units 2 and 5 have dimensions 8 h×5 w×32 d. Partial tiles having dimensions 8 h by 5 w are read out sequentially in the depth direction. Like the partial units 6 and 7, the compressor fills in zero-point values to make the partial tiles up to complete tiles. In the case of partial tiles in units 2 and 5, the zero-point values are added to the right-hand side of the partial tiles. The completed tiles of the resulting cell of data are then compressed and transferred to the DRAM 402.

Finally, partial unit 8 has dimensions of 5 h×5 w×32 d. The partial tiles of dimensions 5 h×5 w are read out sequentially in the depth dimension. At the compressor 502, zero-point values are added to both the bottom and right-hand side of the partial tiles to make the tiles up to a size of 8×8. The completed tiles of the resulting cell of data are then compressed and transferred to the DRAM 402.

For each partial unit, the partial tiles are made up to full size tiles by adding zero-point values. The partial unit is thereby made up to a full unit of data and the feature map data is compressed. The compressed section of feature map data is transferred to the DRAM 402 and stored in a cell.

Figure 10:
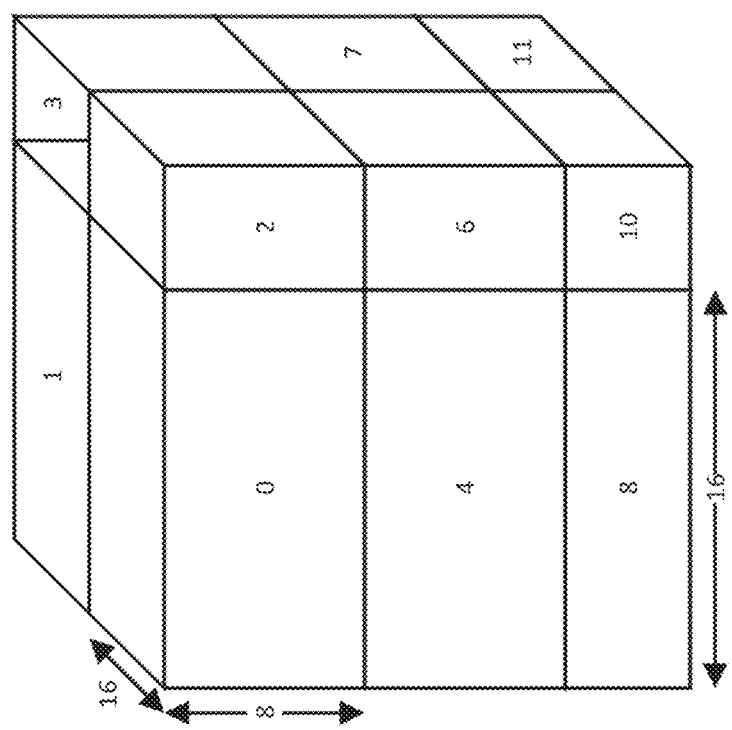
FIG. 10 is a diagram showing the second feature map divided according to the second predetermined format of subdivision.

FIG. 10 shows the same feature map shown in FIG. 9 in a case that the feature map is read from the SRAM 406 and compressed using the wide format of subdivision 701a. In this case, the feature map is traversed with units of dimensions 8 h×16 w×16 d. The feature map is traversed starting at the near top-left of the feature map and traversing in order: depth, width and then height. At each step both tiles of data are read from the SRAM 406, which is to say each unit of data is read sequentially in the depth dimension across the 8 h×16 w section. In this way, because the wide-format unit has a depth of 16 elements, complete units of feature map data labelled 0, 1, 4 and 5 can be formed. As with the example described with reference to FIG. 9, feature map data at some sides (extremities) of the feature map do not form complete units of data. These partial units of feature map data in FIG. 10 are 2, 3, 6, 7, 8, 9 (unit behind 8), 10 and 11, with some of the units being obscured in the figure. Four units 2, 3, 6, 7 have a partial width, two units 8, 9 have partial height and two units 10, 11 have a partial width and partial height.

As described above, as the feature map is traversed, the feature map data of a partial unit is read in partial tiles from the SRAM 406 to the compressor 502. It is recalled that the wide-format of subdivision has a section of two tiles and that the feature map data is compressed in units of tiles. As the partial width of cells 2, 3, 6, 7, 10 and 11 is five elements, which is less than one tile, the compressor fills the partial tiles of data read from the SRAM 406 with zero-point values up to a single tile of data. The compressor 502 does not create a right-hand side tile for the wide-format of subdivision 701a in this case. The partial tiles are filled with zero-point values to make complete tiles by the compressor resulting in a unit of data with a half width (width of a single tile). The half-width unit of data is then compressed on a tile-by-tile basis and the section of compressed data is transferred to the DRAM 402 to be stored in a cell.

For cells 8, 9, 10, and 11 the partial height of the partial tiles of data read from these partial cells is filled with zero-point values as previously described.

A couple of points can be noted on the examples described in connection with FIGS. 9 and 10. Firstly, the feature map data read from the SRAM 406 in both examples is read from the SRAM 406 in patches of 4×4. This is a feature of the hardware of the SRAM 406 and may differ depending on the hardware. As the zero-point values are added at the compressor 502, there is efficiency in reading the feature map data from the SRAM 406 and excess resources are not used reading anything other than the feature map data. Secondly, the feature map data in these examples is always compressed in tiles of feature map data and transferred to the DRAM 402. The sections of data transferred to cells of the DRAM 402 consist of a complete cell of feature map data in the examples above, except in the case of the wide-format of subdivision which is two tiles wide. In the case of the wide-format of subdivision, if the partial width is one tile or less wide, the feature map data is filled with zero-point data to complete only the left-side tile. Accordingly, the sections of compressed data can be stored in cells of the DRAM 402 as previously described, even though the feature map data was not an integer multiple of the unit size.

Figure 11:
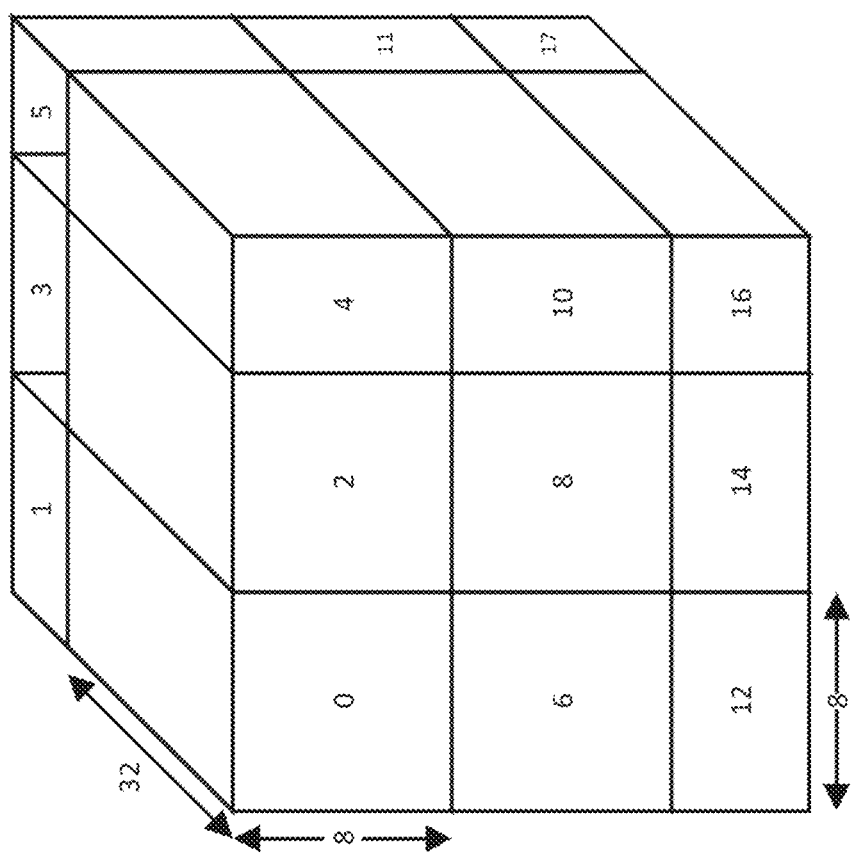
FIG. 11 is a diagram showing a third feature map divided according to the first predetermined format of subdivision.

FIG. 11 is a diagram illustrating a feature map that includes partial units that have a partial depth. The feature map in FIG. 11 has dimensions of 21 h×21 w×37 d. In the example in FIG. 11, the feature map is to be compressed using the deep format of subdivision 801a. As with the previous examples, the feature map data is traversed from the near top-left corner in an order of dimensions: depth, width, height. As can be seen from FIG. 11, complete units of feature map data can be obtained labelled 0, 2, 6, and 8. A further four units 1, 3, 7 (unit behind 6), 9 (unit behind 8) have partial depth, two units 4 and 10 have a partial width, two units 5 and 11 have a partial width and a partial depth, two units 12 and 14 have a partial height, two units 13 (unit behind 12) and 15 (unit behind 14) have a partial height and a partial depth, one unit 16 has a partial width and a partial height and one unit 17 has a partial width, a partial height and a partial depth.

Unit 1 in FIG. 11 has a partial depth. Tiles of data, corresponding to unit 1, are read out from the SRAM 406 sequentially in the depth dimension. Unlike with partial units with partial height and/or width, when the last tile from a partial unit with partial depth is read out from SRAM 406 no further tiles of data for that partial unit are read out. The compressor 502 does not fill in zero-point values for missing data in the depth dimension. As the compression works on complete tiles of feature map data, the feature map data corresponding to the partial unit can be compressed and the section of compressed data, having a partial depth, is stored in a cell on the DRAM 402.

Partial units 3, 7 and 9 are of the same partial depth dimensions as partial unit 1 and the same process is followed. For the other partial units, the following process is followed. Partial units 4, 10, 12, 14 and 16, do not have a partial depth and the same process as previously described in connection with FIG. 9 is followed. That is to say that partial tiles of feature map data are read out from the partial unit in the depth dimension to the compressor 502. The compressor 502 fills the partial tiles of data with zero-point values in the height and/or width dimension to form complete tiles of data. The compressor then compresses the complete unit of data and stores the section of compressed feature map data in a cell in the DRAM 402.

Partial units 5, 11, 13 and 15 and 17 have partial depth and at least one of a partial height or partial width. For these units, partial tiles are read out in the depth dimension until the last partial tile is read out. As before, for each partial tile, the compressor 502 fills in zero-point values in the height and/or width dimension to form a complete tile of data. In each case, the completed tiles of data form a partial unit of data having a partial depth of 5 tiles. The complete tiles of data of the unit, in this case five complete tiles of data, are then compressed by the compressor 502, transferred to the DRAM 402 and stored in a cell on the DRAM 402.

Figure 12:
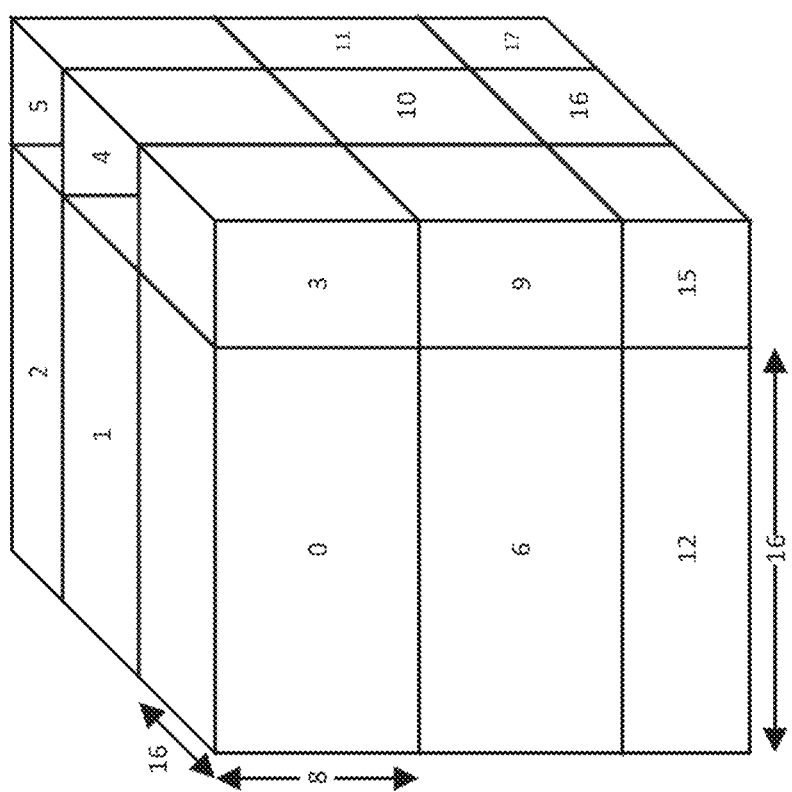
FIG. 12 is a diagram showing the third feature map divided according to the second predetermined format of subdivision.

FIG. 12 is a diagram showing the same feature map data as shown in FIG. 11. FIG. 12 illustrates the case in which the feature map data of dimensions 21 h×21 w×37 d is compressed by reading data in units of the wide format of subdivision 701a. The same general approach described above in connection with FIGS. 10 and 11 is applied. The feature map data is traversed starting from the near top left-hand corner in an order of: depth, width and then height. If a complete unit of feature map data is available, the feature map data is read-out of the SRAM 406 in tiles, the tiles of data are compressed and the section of compressed feature map data is sent to the DRAM 402 and stored in a cell on the DRAM. As before, at extremities of the feature map data forms partial units of data.

If the feature map data forms a partial unit of data having a partial dimension in the height dimension, the partial tiles of data are read out, two across for each cross-section in the depth dimension, and the compressor 502 adds zero-point values to the lower part of the partial tiles of data to make up complete tiles of data. The completed tiles of data can be compressed.

If the partial unit has a partial depth, the tiles or partial tiles of feature map data are read out sequentially until the last tile or partial tile is read out. The compressor 502 does not add zero-point values to make up for missing feature map data in the depth dimension. The resulting tiles of data are compressed and the section of compressed data is transferred to the DRAM 402 to be stored in a cell.

In the case of partial cells 3, 4, 5, 9, 10, 11, 15, 16, 17, these partial cells have a partial width of 5 elements. As described in connection with FIG. 10, as the partial width of these partial cells is less than one tile, the compressor fills the partial tiles of data read from the SRAM 406 with zero-point values up to a single tile of data. The compressor 502 does not create a right-hand side tile for the wide-format of subdivision 701a in this case.

Many different variations of the concept of partial units may be employed. In the examples given above, the feature map data is compressed in tiles of 8 h×8 w. However, in other embodiments, the tile size could be 4 h×4 w or some other size, such as 16 h×16 w etc. The tile size may also extend in the depth direction. Accordingly, the way that the feature map data is compressed is a function of both of the dimensions of the unit in the format of subdivision and tile size. A particular example will now be given for fully connected layers, which is a layer of N uncompressed element values formed in an array of feature map data having dimensions such as 1 h×1 w×Nd or 1 h×2 w×N/2 d.

In an example of compressing a 1 h×1 w×Nd layer, it may be desirable to use a tile size of 1 h×1 w×64 d. The feature map data is read from the SRAM 406 in patches of 4 by 4 because this is a hardware property of the SRAM 406 (although different SRAM may have different properties). However, by applying a tile that extends in the depth dimension, the first tile will contain 64 values of the fully connected layer and the remaining empty values read from the SRAM 406 do not need to be compressed. This leads to efficient compression of the fully connected layer.

It can be seen based on the explanation above that the examples described in connection with FIGS. 9 to 12 are cases in which the tile has a depth of one element and that, in general, the tile of data used for compression may have any depth.

In a case in which the tile has a depth dimension, as the data is compressed on a tile-by-tile basis, the feature map data read from the SRAM needs to be filled with zero-point values at the compressor so that the data has a depth that is an integer multiple of the tile size in the depth dimension. In some embodiments, the data may be filled with zero-point values up to the dimension of the unit. In other embodiments, it may be preferable for the compressor to fill the data with zero-point values up to the nearest multiple of the tile depth.

Operation of the decompressor 505 is similar to that described previously. The decompressor 505 reads sections of compressed feature map data from the DRAM 402 and decompresses the sections of compressed data on a tile-by-tile basis. The decompressor 505 is provided with information about the size of the feature map data being decompressed and writes the decompressed feature map data to the SRAM 406 accordingly. For feature map data from a cell that includes less than a unit's worth of feature map data in the depth dimension, the decompressor stops writing feature map data to the SRAM 406 at the end of decompressed section of data. For feature map data from a cell corresponding to a partial unit having a partial width or partial height, the decompressor writes feature map data to the SRAM 406 up to the known dimensions of the feature map data and discards zero-point values that have been added to fill the data up to the tile size. By discarding the filled zero-point values in this way, unnecessary write operations to the SRAM 406 are avoided thereby saving power.

The use of partial cells as described above may allow power savings, which may be important in processors for use in power-limited devices, such as mobile devices. The read operations from the SRAM are fewer because read operations to the SRAM are only made for patches in which feature map data is present. Zero-point values are added to the data at the compressor which may allow for improved compression relative to feature map data that is uncompressed or not compressed for a full tile of data. The improved compression may save power both in transfer of data to the DRAM and in write operations to areas of the DRAM associated with the corresponding cell of data. On the decompression side, the same savings may be available because better compression may allow for fewer read operations from the DRAM, and less power to transfer the data from the DRAM to the decompressor. At the decompressor the filled zero-point values are discarded, so that write operations to the SRAM are the number of write operations required to write actual feature map data to the SRAM.

Whilst in the above examples, feature maps, and portions of feature maps, are shown in three dimensions, it is to be understood that the invention applies to feature maps which comprise any number of dimensions. Whilst in the above examples, the data processing system is shown as having an NPU, it is to be understood that the invention applies to other processing circuitry such as a CPU or GPU which is used to process neural networks. Whilst in the above examples, the external storage circuitry is shown as being DRAM, it is to be understood that the invention applies to other external storage circuitry types. Whilst in the above examples, the local storage circuitry is shown as being SRAM, it is to be understood that the invention applies to other local storage circuitry types. Whilst in the above examples, the storage circuitry which facilitates the reading and writing of data between the local storage circuitry and external storage circuitry is shown as being a DMA, it is to be understood that the invention applies to other storage circuitry types which can be used to mediate the transfer of data.

A further example, referred to as a first exemplary embodiment, provides a method of compressing data for transfer between a local storage of a processor and an external storage, wherein the data is part of an array of data of at least a portion of a layer of a neural network and has three or more dimensions, the method comprising: sequentially reading data stored in the local storage to a compressor in units of data along a first dimension of the array of data, each unit having a predetermined unit size in the first dimension corresponding to an integer number of a tile size in the first dimension of tiles of data; at an extremity of the array in the first dimension, reading a partial unit of data in a case that the array size in the first dimension of the array of the data is not an integer multiple of the unit size in the first dimension of the unit; filling data of the partial unit of data, at the compressor, to form filled data containing an integer number of tiles of data; compressing, at the compressor, the filled data on a tile-by-tile basis to form compressed data; and transferring the compressed data associated with the unit of data to the external storage.

The three or more dimensions may include a height dimension, a width dimension and a depth dimension. The first dimension may be one of the width dimension, height dimension and depth dimension.

The three or more dimensions may include a height dimension, a width dimension and a depth dimension, and reading the data for a unit may comprises sequentially reading tiles or partial tiles of data in the depth dimension.

The method may further comprise reading one or more partial units of data from the array having a partial depth, wherein the compressor fills the data so that the filled data has a depth that is an integer multiple of the depth of the tile of data.

The unit may have a unit size of two or more times the tile size in the first dimension and the compressor may fill the partial unit of data to at least one of a width, height and depth that is less than the width or height of the unit.

Filling data of the partial unit of read data may comprise the compressor adding zero-point values to the data.

Compressing the filled data on a tile-by-tile basis may be performed with reference to a zero-point value, wherein during compression a zero-point value is assigned for at least one of: the neural network, the layer of the neural network and a depth value of the array of data.

The three or more dimensions may include a height dimension, a width dimension and a depth dimension, the data may be feature map data of a fully connected layer of a neural network, and the tile of data may have a larger size in the depth dimension than sizes in the width and height dimensions.

Compressing each tile of data may comprise using at least one of variable length codes, zero-run encoding, and delta encoding over a tile of data.

A second exemplary embodiment provides a data processing system comprising: a processor comprising a local storage and a compressor, and an external storage, wherein data processing system is configured to perform a method of compressing data for transfer between the local storage and the external storage, wherein the data is part of an array of data of at least a portion of a layer of a neural network and has three or more dimensions, the method comprising: sequentially reading data stored in the local storage to the compressor in units of data along a first dimension of the array, each unit having a predetermined unit size in the first dimension corresponding to an integer number of a tile size in the first dimension of tiles of data; at an extremity of the array in the first dimension, reading a partial unit of data in a case that the array size in the first dimension of the array of the data is not an integer multiple of the unit size in the first dimension of the unit; filling data of the partial unit of data, at the compressor, to form filled data containing an integer number of tiles of data, compressing, at the compressor, the filled data on a tile-by-tile basis to form compressed data, and transferring the compressed data associated with the unit of data to the external storage.

A third exemplary embodiment provides a method of transferring compressed data between an external storage and a local storage of a processor, wherein the compressed data contains data, which is part of an array of data of at least part of a layer of a neural network and has three or more dimensions, that has been compressed using a method according to the first exemplary embodiment, the method comprising: obtaining dimensions of the array of data, sequentially reading compressed data associated with units of the array of data stored in the external storage; decompressing, by a decompressor, the read compressed data to obtain decompressed data, wherein decompressing includes discarding filled data that was filled into partial units of data during compression of the data on the basis of the obtained dimensions of the array of data; and writing the decompressed data to the local storage.

There may be provided a program that, when executed on a processor, causes the processor to perform a method according to a preceding exemplary embodiment. There may be provided a non-transitory computer-readable storage medium storing a program that, when executed on a processor, causes the process to perform a method according to a preceding exemplary embodiment.

A fourth exemplary embodiment may provide a data processing system comprising: a processor comprising a local storage and a decompressor, and an external storage, wherein data processing system is configured to perform a method of transferring compressed data between the external storage and the local storage of the processor, wherein the compressed data contains data, which is part of an array of data of at least part of a layer of a neural network and has three or more dimensions, that has been compressed using a method according to the first exemplary embodiment, the method comprising: obtaining dimensions of the array of data, sequentially reading compressed data associated with units of the array of data stored in the external storage; decompressing, by a decompressor, the read compressed data to obtain decompressed data, wherein decompressing includes discarding filled data that was filled into partial units of data during compression of the data on the basis of the obtained dimensions of the array of data; and writing the decompressed data to the local storage.

It is to be understood that any feature described in relation to any one example may be used alone, or in combination with other features described, and may also be used in combination with one or more features of any other of the examples, or any combination of any other of the examples. Furthermore, equivalents and modifications not described above may also be employed without departing from the scope of the disclosure, which is defined in the accompanying claims.

What is claimed is:

1. A method of compressing data for transfer between a local storage of a processor and an external storage, wherein the data is part of an array of data of at least a portion of a layer of a neural network and has three or more dimensions including a height dimension, a width dimension and a depth dimension, the method comprising:
sequentially reading data stored in the local storage to a compressor in units of data along a depth dimension of the array of data, each unit having a predetermined unit size in the depth dimension corresponding to an integer number of a depth of a predetermined tile size, wherein the depth of the predetermined tile size is greater than one;
at an extremity of the array in the depth dimension, reading a partial unit of data in a case that the array size in the depth dimension of the array of the data is not an integer multiple of the unit size in the depth dimension of the unit;
compressing, at the compressor, the units of data that have the predetermined unit size to form sections of compressed data that have a size that does not exceed a size of an associated allocated storage in the external storage;
filling the partial unit of data with zero-point values, at the compressor, to form filled data containing an integer number of tiles of data so that the filled data has a partial depth that is an integer multiple of the depth of the predetermined tile size and is less than the predetermined unit size;
compressing, at the compressor, the filled data on a tile-by-tile basis to form a section of compressed data; and
transferring each section of compressed data the external storage for storage in a respective allocated storage space in the external storage.

2. The method according to claim 1 wherein compressing the filled data on a tile-by-tile basis is performed with reference to the zero-point value, wherein during compression a zero-point value is assigned for at least one of the neural network, the layer of the neural network and a depth value of the array of data.

3. The method according to claim 1 wherein the data is feature map data of a fully connected layer of a neural network, and the tile of data has a larger size in the depth dimension than sizes in the width and height dimensions.

4. The method according to claim 1, wherein compressing each tile of data comprises using at least one of variable length codes, zero-run encoding, and delta encoding over a tile of data.

5. A data processing system comprising:
a processor comprising a local storage and a compressor, and
an external storage,
wherein data processing system is configured to perform a method of compressing data for transfer between the local storage and the external storage, wherein the data is part of an array of data of at least a portion of a layer of a neural network and has three or more dimensions including a height dimension, a width dimension and a depth dimension, the method comprising:
sequentially reading data stored in the local storage to the compressor in units of data along a depth dimension of the array, each unit having a predetermined unit size in the depth dimension corresponding to an integer number of a depth of a predetermined tile size, wherein the depth of the predetermined tile size is greater than one;
at an extremity of the array in the depth dimension, reading a partial unit of data in a case that the array size in the depth dimension of the array of the data is not an integer multiple of the unit size in the depth dimension of the unit;

compressing, at the compressor, the units of data that have the predetermined unit size to form sections of compressed data that have a size that does not exceed a size of an associated allocated storage in the external storage;

filling the partial unit of data with zero-point values, at the compressor, to form filled data containing an integer number of tiles of data so that the filled data has a partial depth that is an integer multiple of the depth of the predetermined tile size and is less than the predetermined size;

compressing, at the compressor, the filled data on a tile-by-tile basis to form a section of compressed data, and transferring each section of compressed data to the external storage for storage in a respective allocated storage space in the external storage.

* * * * *